US012782834B2

(12) United States Patent
Sobolev et al.

(10) Patent No.: US 12,782,834 B2
(45) Date of Patent: Nov. 3, 2026

(54) MULTIPLE OFF-AXIS ILLUMINATION BEAMS FOR WAFER ALIGNMENT SENSOR

(71) Applicant: ASML Netherlands B.V., Veldhoven (NL)

(72) Inventors: Kirill Urievich Sobolev, Brookfield, CT (US); Krishanu Shome, Cheshire, CT (US)

(73) Assignee: ASML NETHERLANDS B.V., Veldhoven (NL)

( * ) Notice: Subject to any disclaimer, the term of this patent is extended or adjusted under 35 U.S.C. 154(b) by 76 days.

(21) Appl. No.: 18/875,589

(22) PCT Filed: Jun. 7, 2023

(86) PCT No.: PCT/EP2023/065179
§ 371 (c)(1),
(2) Date: Dec. 16, 2024

(87) PCT Pub. No.: WO2023/247178
PCT Pub. Date: Dec. 28, 2023

(65) Prior Publication Data

US 2026/0016762 A1 Jan. 15, 2026

Related U.S. Application Data

(60) Provisional application No. 63/355,220, filed on Jun. 24, 2022.

(51) Int. Cl.
*G03F 9/00* (2006.01)

(52) U.S. Cl.
CPC .......... *G03F 9/7069* (2013.01); *G03F 9/7096* (2013.01)

(58) Field of Classification Search
CPC ..... G03F 9/7069; G03F 9/7096; G03F 9/7065
See application file for complete search history.

(56) References Cited

U.S. PATENT DOCUMENTS 4,779,001 A * 10/1988 Makosch .............. G03F 9/7049 250/548
6,141,107 A 10/2000 Nishi et al.

(Continued)

FOREIGN PATENT DOCUMENTS

EP 1 020 739 A2 7/2000
WO WO 2009/078708 A1 6/2009
WO WO 2020/057900 A1 3/2020

OTHER PUBLICATIONS

International Search Report and Written Opinion of the International Searching Authority directed to International Patent Application No. PCT/EP2023/065179, mailed Sep. 6, 2023; 9 pages.

(Continued)

*Primary Examiner* — Hung V Nguyen
(74) *Attorney, Agent, or Firm* — Pillsbury Winthrop Shaw Pittman, LLP

(57) ABSTRACT

A novel approach for an alignment system by using glass plates to create off-axis illumination beams is described. A pair of glass plates is inserted into an alignment system to create a pair of off-axis illumination beams. The off-axis illumination beams pass through an aperture stop. A transmissive optic with a plurality of fully reflective mirrors reflects the beams toward the objective. Thereafter, the objective focuses the beams onto the alignment mark on the substrate. The diffracted beam is then detected and analyzed to determine alignment of the substrate. The compact nature of the glass plate alignment system significantly reduces the optical system footprint.

20 Claims, 10 Drawing Sheets

(56) References Cited

U.S. PATENT DOCUMENTS

| | | | | |
|---|---|---|---|---|
| 10,073,330 | B2 * | 9/2018 | Kawasumi | G03B 21/2073 |
| 10,732,524 | B2 | 8/2020 | Shome et al. | |
| 2017/0160075 | A1 | 6/2017 | Kreuzer et al. | |
| 2021/0072021 | A1 * | 3/2021 | Hill | G01B 11/272 |
| 2025/0085646 | A1 * | 3/2025 | Sobolev | G03F 9/7065 |

OTHER PUBLICATIONS

"Combined scanning confocal microscopy with dark-field microscopy," Research Disclosure No. 681063, Dec 14, 2020; 4 pages.

"Design for Multiple Off-Axis Illumination Beams for Wafer Alignment Sensor," Research Disclosure No. 700076, Jul. 11, 2022; 31 pages.

* cited by examiner

MULTIPLE OFF-AXIS ILLUMINATION BEAMS FOR WAFER ALIGNMENT SENSOR

CROSS-REFERENCE TO RELATED APPLICATIONS

This application claims priority of U.S. application 63/355,220 which was filed on Jun. 24, 2022 and which is incorporated herein in its entirety by reference.

TECHNICAL FIELD

The present disclosure relates to an alignment system that may be used, for example, in a lithographic apparatus.

BACKGROUND

A lithographic apparatus is a machine that applies a desired pattern onto a target portion of a substrate. Lithographic apparatuses can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatuses include so-called steppers, in which each target portion is irradiated by exposing an entire pattern onto the target portion in one exposure, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks, which may comprise diffraction gratings are placed on the substrate to be aligned and are located with reference to a second object. Lithographic apparatus may use an alignment system for detecting positions of the alignment marks and for aligning the substrate using the alignment marks to ensure accurate exposure from a mask.

Alignment systems typically have their own illumination system that may be used to illuminate the alignment marks during alignment measurements. Determining alignment typically includes determining the position of an alignment mark (or marks) and/or other target in a layer of a semiconductor device structure. Alignment is typically determined by irradiating an alignment mark with radiation, and comparing characteristics of different diffraction orders of radiation reflected from the alignment mark. Similar techniques are used to measure overlay and/or other parameters. Current alignment sensors have a single measurement illumination spot projected onto a substrate (e.g., a wafer). The single illumination spot is used for measurements of multiple alignment parameters, phase, and intensity detection. Current sensors measure metrology marks serially. Thus, the number of measured marks on a given substrate is limited by throughput considerations.

Alignment can be performed using off-axis illumination beams. Illumination beams are considered off-axis when they are not normal to the substrate. Contrast this to an on-axis illumination beam, which comes down the center of the optical axis normal to the substrate. Off-axis illumination helps in detecting finer pitch alignment marks using the existing objective system. As a result, the process window can be increased for the customer.

SUMMARY

Disclosed are novel systems and methods to create off-axis illumination beams. Off-axis illumination using glass plates design if compared to grating-based off-axis illumination results in space savings within the optical system. The use of glass plates for illumination can create colinear beams of different wavelengths, as opposed to the dispersed spectrum of light for grating-based illumination. The glass plates can be finely adjusted, allowing for better control of the off-axis illumination beams.

According to an embodiment, an alignment illumination system includes an illumination source, at least a pair of glass plates, a transmissive optic with at least one reflective mirror configured to reflect radiation received from the glass plates, and an objective configured to focus light from the transmissive optic towards an object to be illuminated. Each glass plate has a plurality of spot mirrors that can reflect or partially reflect and transmit an illumination beam from the illumination source.

In an embodiment, the optical system reflects and refracts the illumination beam to create pairs of off-axis illumination beams. In an embodiment, the off-axis illumination beams in each pair are in phase with each other.

In an embodiment, the optical path differences of the off-axis illumination beams in each pair can be controlled by tilting one glass plate in the pair with respect to the other using a glass plate drive motor.

In an embodiment, the off-axis illumination beams have small color separation or are colinear for different wavelengths. In an embodiment, the illumination angles for all colors of the off-axis illumination beams are the same.

In an embodiment, the spectral content of the off-axis or the on-axis illumination beams can be controlled by adding thin film coatings onto the spot mirrors.

In an embodiment, the off-axis illumination beams are polarized by adding thin film coatings onto the spot mirrors. In an embodiment, the off-axis illumination beams are unpolarized.

In an embodiment, an aperture plate positioned between the glass plates and the transmissive optic blocks unwanted radiation. In an embodiment, the aperture plate blocks an on-axis illumination beam and allows off-axis illumination beams to pass through. In an embodiment, the aperture plate blocks off-axis illumination beams and allows an on-axis illumination beam to pass through. In an embodiment, the aperture plate allows an on-axis illumination beam and off-axis illumination beams to pass through.

In an embodiment, the plurality of spot mirrors comprises metal or dielectric or a combination thereof.

In an embodiment, the at least a pair of glass plates comprises exactly two glass plates. In an embodiment, the two glass plates create a pair of off-axis illumination beams.

In an embodiment, the at least a pair of glass plates comprises four glass plates to create two pairs of off-axis illumination beams.

In an embodiment, an alignment system measuring alignment of an object. An alignment illumination system and an adjustable aperture stop can be inserted into the alignment system to create pairs of off-axis illumination beams.

According to an embodiment, an alignment system includes an illumination source, at least a pair of glass plates, an aperture stop, a transmissive optic with at least one reflective mirror configured to reflect radiation received from the glass plates, an objective configured to focus light from the transmissive optic towards an object to be illuminated, an object stage for holding an object, and an interferometer configured to measure a mark on the object. Each glass plate has a plurality of spot mirrors that can reflect or partially reflect and transmit an illumination beam from the illumination source.

According to an embodiment, a method for alignment using an alignment illumination system includes illuminating an illumination beam from an illumination source, reflecting the illumination beam from the illumination source using at least a pair of glass plates, reflecting radiation received from the glass plates using a transmissive optic with at least one reflective mirror, and focusing light from the transmissive optic towards an object to be illuminated using an objective. Each glass plate has a plurality of spot mirrors.

According to an embodiment, a method for alignment using an alignment illumination system includes illuminating an illumination beam from an illumination source, reflecting or partially reflecting and transmitting the illumination beam from the illumination source using at least a pair of glass plates, filtering radiation received from the glass plates using an aperture stop, reflecting radiation received from the aperture stop using a transmissive optic with at least one reflective mirror, focusing light from the transmissive optic towards an object held by an object stage to be illuminated using an objective, and measuring a mark on the object using an interferometer. Each glass plate has a plurality of spot mirrors.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

DETAILED DESCRIPTION

Figure 1:
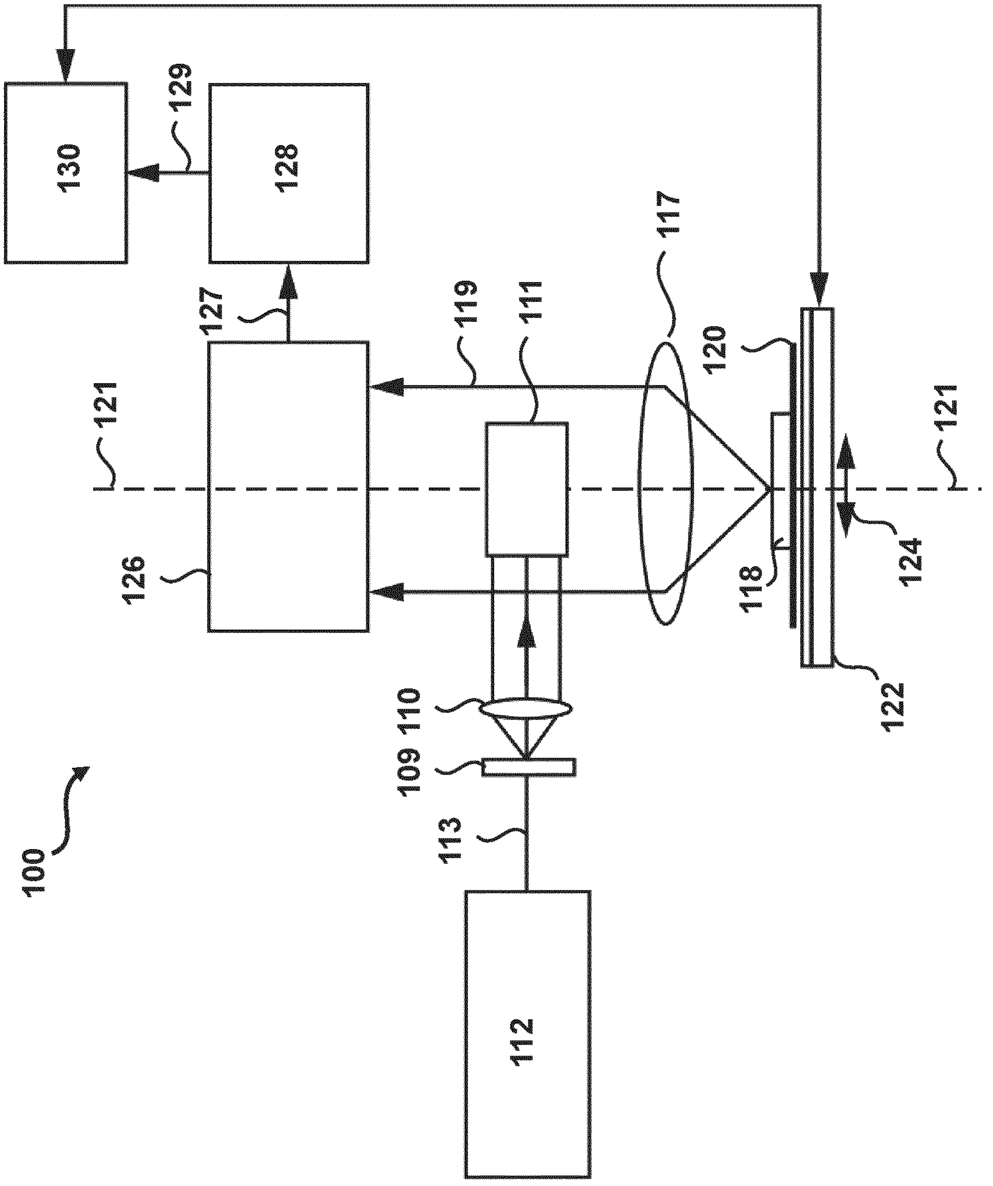
FIG. 1 is a schematic illustration of an alignment system that uses a grating-based illumination structure.

FIG. 1 shows an alignment system 100 that uses a grating structure 109 to create off-axis illumination beams. Alignment system 100 may include an illumination system 112, a grating structure 109, a lens 110, a mirror 111, an objective 117, a stage 122 movable along direction 124, an image rotation interferometer 126, a detector 128, and a signal analyzer 130. The illumination system 112 generates radiation beam 113 that impinges upon the grating structure 109. The gratings of the grating structure 109 diffracts radiation beam 113 into a wide angle of light rays. Subsequently, lens 110 focuses radiation beam 113 onto mirror 111. Mirror 111 may be configured to direct radiation beam 113 onto a substrate 120 for illuminating an alignment mark 118.

Radiation beam 113 then reflects off the alignment mark 118 to become diffracted radiation beam 119, which is directed toward image rotation interferometer 126 along alignment axis 121. Thereafter, signal 127 is passed to detector 128 to detect a position of the substrate 120. Signal analyzer 130 then receives signal 129 to determine a position of the stage 122 and correlate the position of the stage 122 with the position of the center of symmetry of alignment mark 118.

An issue with this grating structure alignment system is that since the grating structure diffracts the radiation beam into a wide angle of light rays, the radiation beam covers a significant amount of space. Preserving all of the beam, which includes chromatic light at different angles, requires a large amount of volume that is dedicated to the transmission of the light. As a result, the grating alignment system is unwieldy and cumbersome.

In contrast to the system shown in FIG. 1, the present alignment system uses glass plates to create off-axis illumination beams. As few as two beams can be used, which is significantly less than for gratings. Reducing the amount of beams from a wide beam used in grating alignment to only two beams in glass plate alignment, much space can be saved within the optical system. As a result, the footprint of the optical system can be greatly reduced. Further, other advantages of using glass plates for alignment include all wavelengths being colinear, as opposed to the dispersed spectrum of light for grating alignment. The glass plates can be finely adjusted, allowing for better control of the off-axis illumination beams. Another benefit of off-axis alignment using glass plates is in efficiency. Only the needed number of off-axis illumination beams is created, while grating-based illumination would generally have additional diffraction orders that have to be blocked or otherwise removed from the system.

Before describing such embodiments in more detail, however, it is instructive to present an example environment in which embodiments of the present invention may be implemented.

Example Reflective and Transmissive Lithographic Systems

Figure 2A:
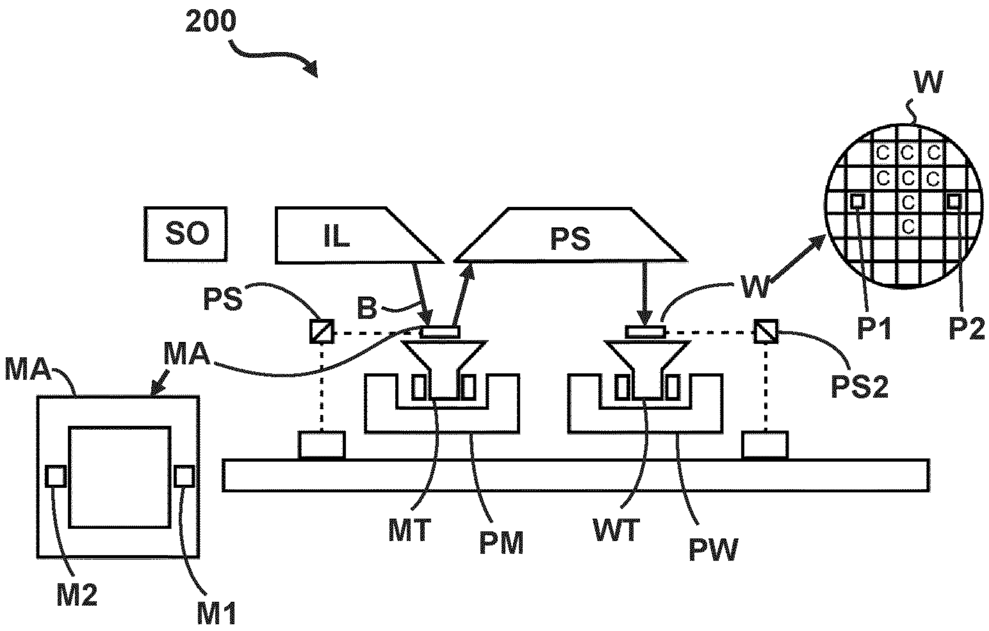
FIG. 2A is a schematic illustration of a reflective lithographic apparatus according to an embodiment of the present disclosure.
Figure 2B:
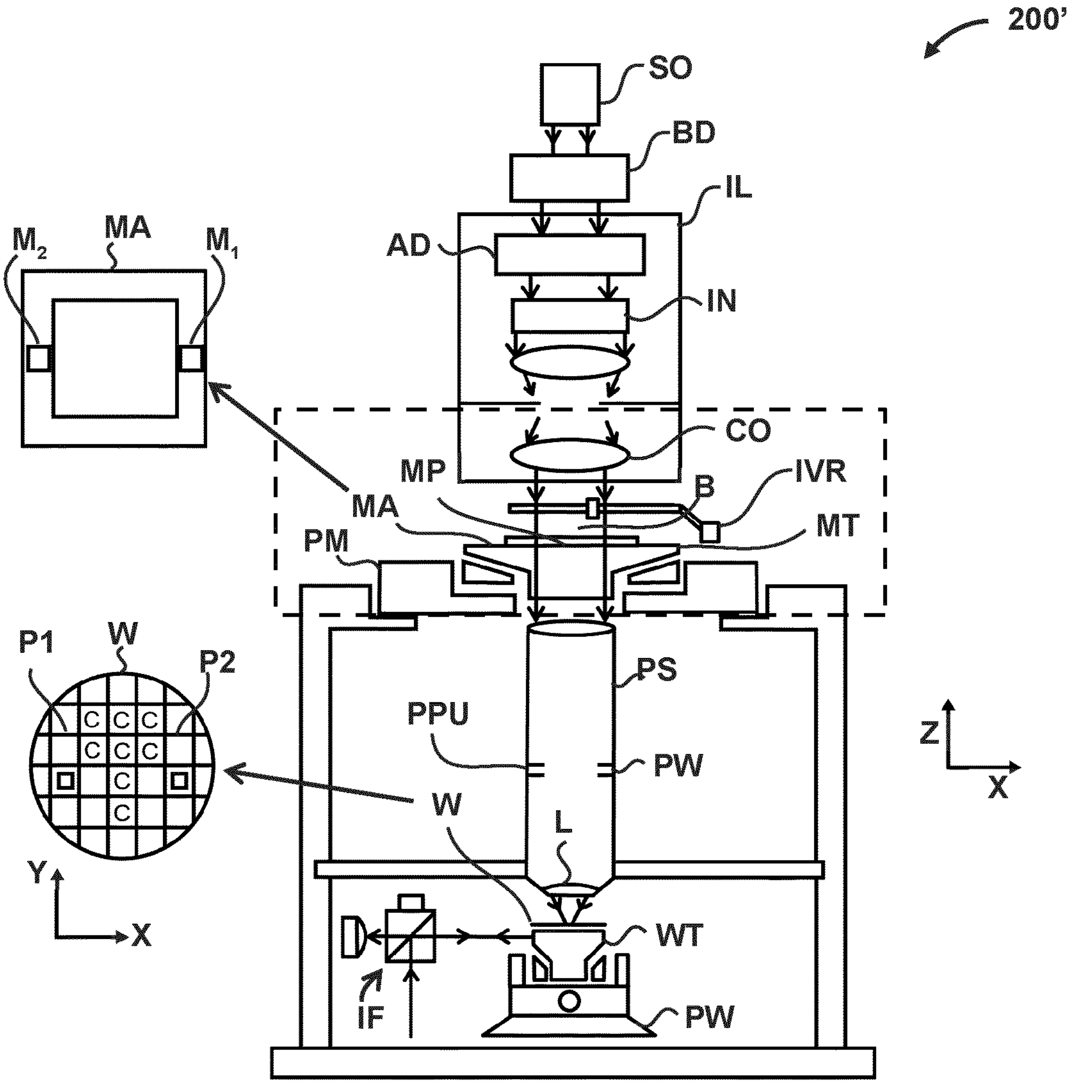
FIG. 2B is a schematic illustration of a transmissive lithographic apparatus according to an embodiment of the present disclosure.

FIGS. 2A and 2B are schematic illustrations of a lithographic apparatus 200 and lithographic apparatus 200', in or for which embodiments of the present disclosure may be implemented. Lithographic apparatus 200 and lithographic apparatus 200' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 200 and 200' also have a projection system PS configured to project a pattern imparted to the radiation beam B by patterning device MA onto a target portion (for example, comprising one or more dies) C of the substrate W. In lithographic apparatus 200, the patterning device MA and the projection system PS are reflective. In lithographic apparatus 200', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B. The support structure MT holds the patterning device MA in a manner that depends on the orientation of the patterning device MA with respect to a reference frame, the design of at least one of the lithographic apparatus 200 and 200', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 200' of FIG. 2B) or reflective (as in lithographic apparatus 200 of FIG. 2A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 200 and/or lithographic apparatus 200' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 2A and 2B, the illuminator IL receives a radiation beam from a radiation source SO. The source SO and the lithographic apparatus 200, 200' can be separate physical entities, for example, when the source SO is an excimer laser. In such cases, the source SO is not considered to form part of the lithographic apparatus 200 or 200', and the radiation beam B passes from the source SO to the illuminator IL with the aid of a beam delivery system BD (in FIG. 2B) including, for example, suitable directing mirrors and/or a beam expander. In other cases, the source SO can be an integral part of the lithographic apparatus 200, 200'—for example when the source SO is a mercury lamp. The source SO and the illuminator IL, together with the beam delivery system BD, if required, can be referred to as a radiation system.

The illuminator IL can include an adjuster AD (in FIG. 2B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 2B), such as an integrator IN and a condenser CO. The illuminator IL can be used to condition the radiation beam B to have a desired uniformity and intensity distribution in its cross section.

Referring to FIG. 2A, the radiation beam B is incident on the patterning device (for example, mask) MA, which is held on the support structure (for example, mask table) MT, and is patterned by the patterning device MA. In lithographic apparatus 200, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 2B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 2B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 200 and 200' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In some embodiments, lithographic apparatus 200 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2C:
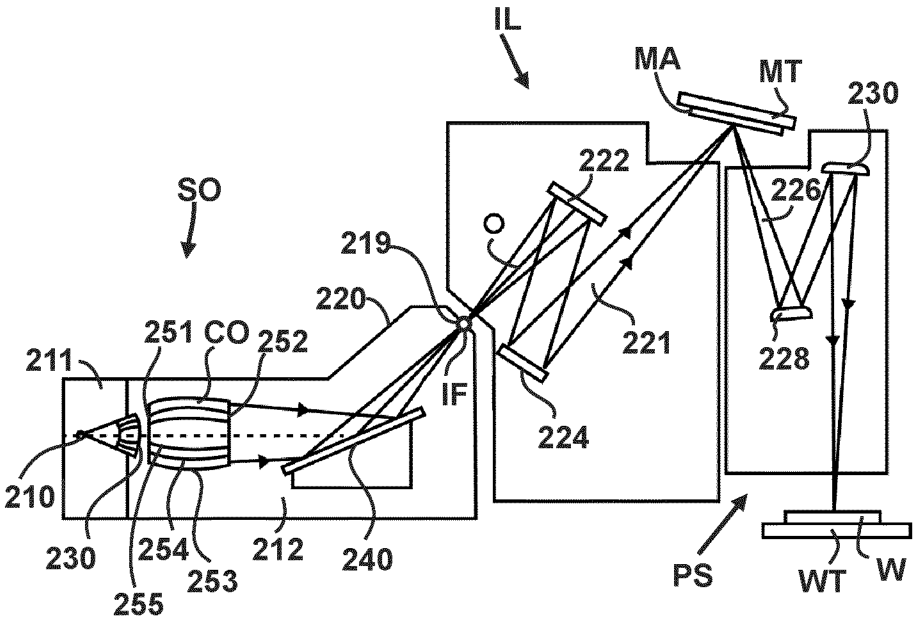
FIG. 2C is a more detailed schematic illustration of the reflective lithographic apparatus, according to an embodiment of the present disclosure.

FIG. 2C shows the lithographic apparatus 200 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGS., for example there may be 1-6 additional reflective elements present in the projection system PS than shown in FIG. 2C.

Collector optic CO, as illustrated in FIG. 2C, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3A:
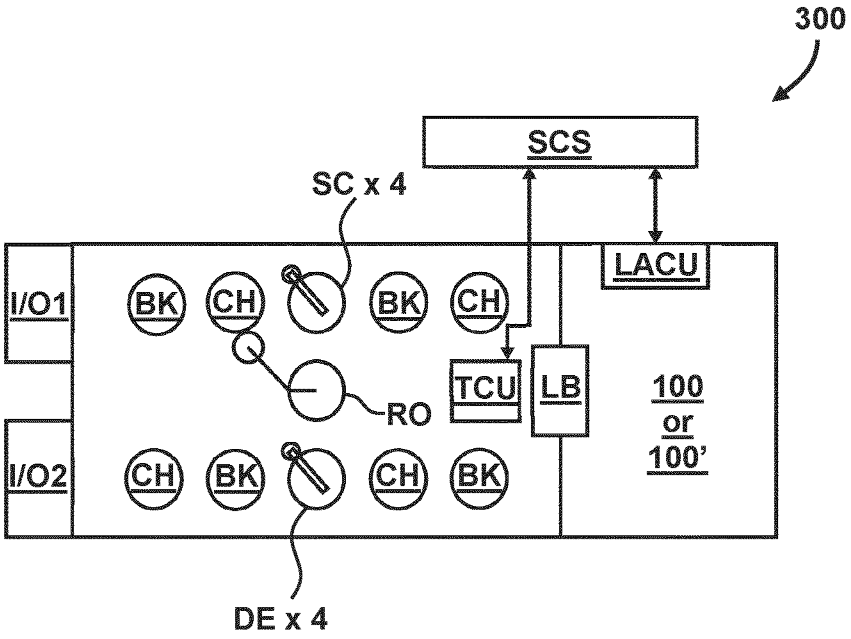
FIG. 3A is a schematic illustration of a lithographic cell, according to an embodiment of the present disclosure.

FIG. 3A shows a lithographic cell 300, also sometimes referred to a lithocell or cluster. Lithographic apparatus 200 or 200' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Alignment System Embodiment

One or more targets are specifically provided on the substrate to enable alignment. Typically, the target is specially designed and may comprise a periodic structure. For example, the target on a substrate may comprise one or more 1-D periodic structures (e.g., geometric features such as gratings), which are printed such that after development, the periodic structural features are formed of solid resist lines. As another example, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

Figure 3B:
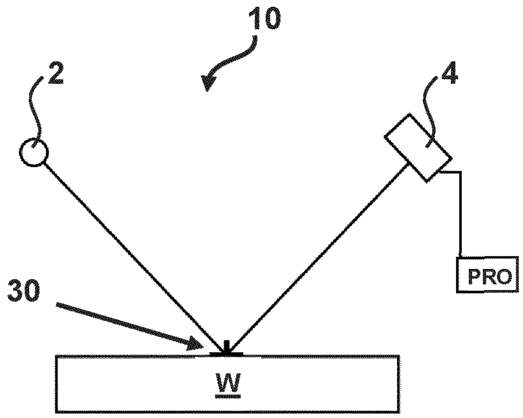
FIG. 3B is a schematic illustration of an inspection system, according to an embodiment of the present disclosure.
Figure 3C:
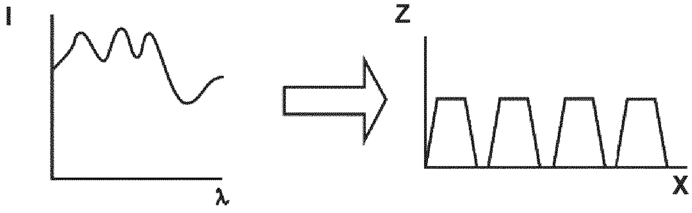
FIG. 3C is a schematic illustration of a metrology technique, according to an embodiment of the present disclosure.

FIG. 3B depicts an example alignment system 10 that may be used to detect alignment as well as overlay and/or perform other metrology operations. It comprises a radiation or illumination source 2 which projects or otherwise irradiates radiation onto a substrate W (e.g., which may typically include a metrology mark). The redirected radiation is passed to a sensor such as a spectrometer detector 4 and/or other sensors, which measures a spectrum (intensity as a function of wavelength) of the specular reflected and/or diffracted radiation, as shown, e.g., in the graph on the left of FIG. 3C. The sensor may generate an alignment signal conveying alignment data indicative of properties of the reflected radiation. From this data, the structure or profile giving rise to the detected spectrum may be reconstructed by one or more processors PRO, a generalized example of which is shown in FIG. 3C, or by other operations.

As in the lithographic apparatus 200 and 200' of FIGS. 2A and 2B, one or more substrate tables may be provided to hold the substrate W during measurement operations. The one or more substrate tables may be similar or identical in form to the substrate table WT of FIGS. 2A and 2B. In an example where inspection system 10 is integrated with the lithographic apparatus, they may even be the same substrate table. Coarse and fine positioners may be provided and configured to accurately position the substrate in relation to a measurement optical system. Various sensors and actuators are provided, for example, to acquire the position of a target portion of interest of a structure (e.g., a metrology mark), and to bring it into position under an objective lens. Typically, many measurements will be made on target portions of a structure at different locations across the substrate W. The substrate support can be moved in X and Y directions to acquire different targets, and in the Z direction to obtain a desired location of the target portion relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and the substrate moves. Provided the relative position of the substrate and the optical system is correct, it does not matter in principle which one of those is moving, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

For typical alignment measurements, a target (portion) 30 on substrate W may be a 1-D grating, which is printed such that after development, the bars are formed of solid resist lines (e.g., which may be covered by a deposition layer), and/or other materials. Or the target 30 may be a 2-D grating, which is printed such that after development, the grating is formed of solid resist pillars, and/or other features in the resist.

The bars, pillars, vias, and/or other features may be etched into or on the substrate (e.g., into one or more layers on the substrate), deposited on a substrate, covered by a deposition layer, and/or have other properties. Target (portion) 30 (e.g., of bars, pillars, vias, etc.) is sensitive to changes in processing in the patterning process (e.g., optical aberration in the lithographic projection apparatus such as in the projection system, focus change, dose change, etc.) such that process variation manifests in variation in target 30. Accordingly, the measured data from target 30 may be used to determine an adjustment for one or more of the manufacturing processes, and/or used as a basis for making the actual adjustment.

For example, the measured data from target 30 may indicate overlay for a layer of a semiconductor device. The measured data from target 30 may be used (e.g., by the one or more processors PRO and/or other processors) for determining one or more semiconductor device manufacturing process parameters based on the overlay, and determining an adjustment for a semiconductor device manufacturing apparatus based on the one or more determined semiconductor device manufacturing process parameters. In some embodiments, this may comprise a stage position adjustment, for example, or this may include determining an adjustment for a mask design, a metrology target design, a semiconductor device design, an intensity of the radiation, an incident angle of the radiation, a wavelength of the radiation, a pupil size and/or shape, a resist material, and/or other process parameters.

Figure 3D:
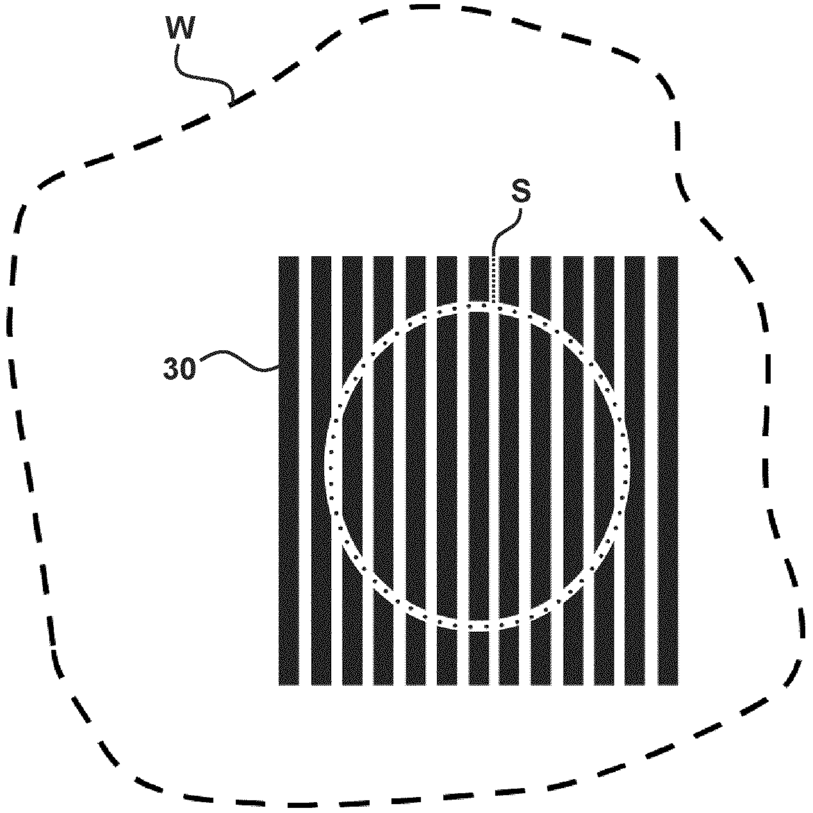
FIG. 3D is a schematic illustration of the relationship between a radiation illumination spot of an inspection system and a metrology target, according to an embodiment of the present disclosure.
Figure 5:
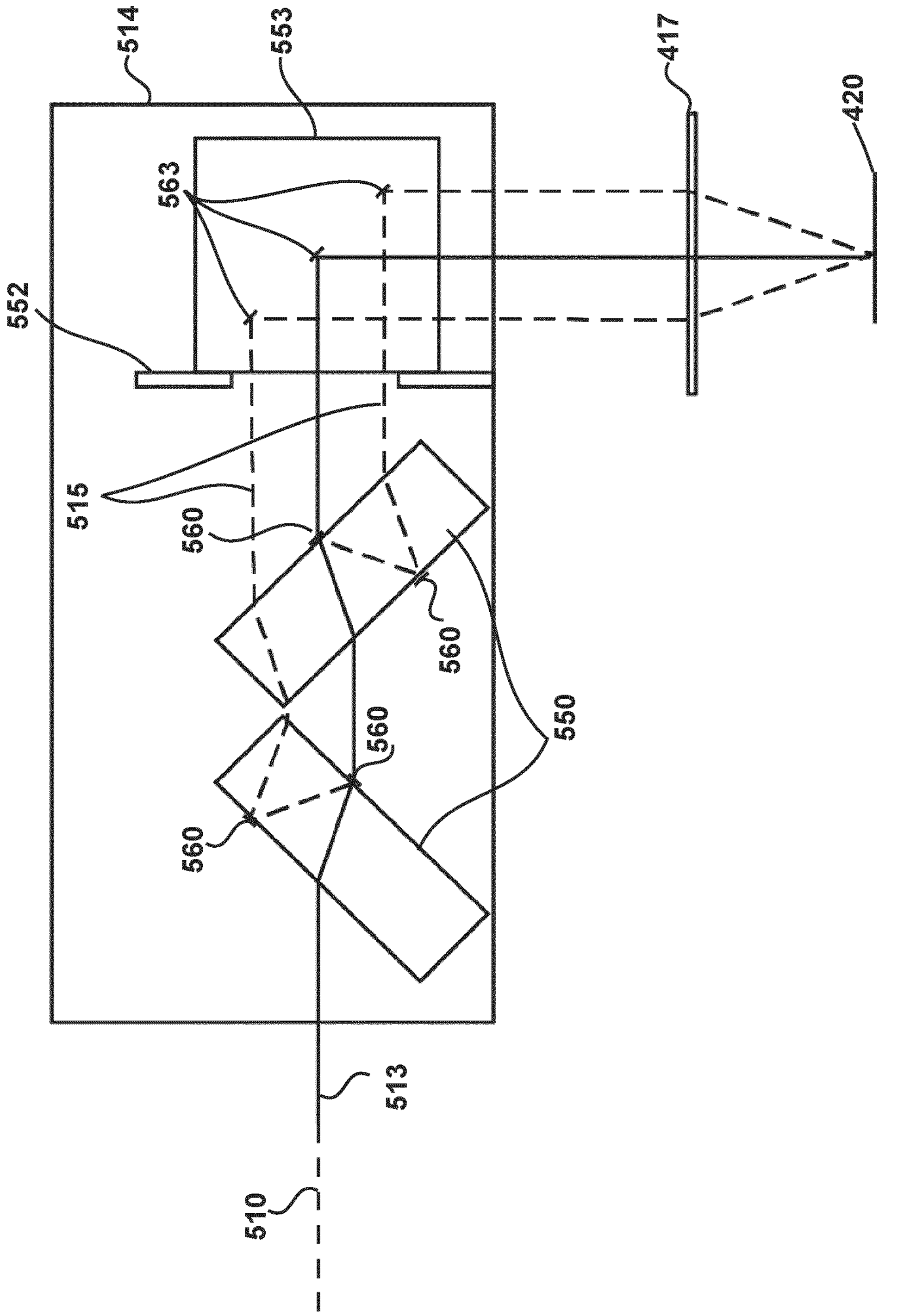
FIG. 5 is a schematic illustration of an optical system of an alignment system having a pair of off-axis illumination beams, according to an embodiment of the present disclosure.

FIG. 3D illustrates a plan view of a typical target (e.g., metrology mark) 30, and the extent of a typical radiation illumination spot S in the system of FIG. 5. Typically, to obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target, in other words, is 'underfilled' by the illumination, and the diffraction signal is essentially free from any signals from product features and the like outside the target itself. The illumination arrangement may be configured to provide illumination of a uniform intensity across a back focal plane of an objective, for example. Alternatively, by, for example, including an aperture in the illumination path, illumination may be restricted to on-axis or off-axis directions.

Figure 4:
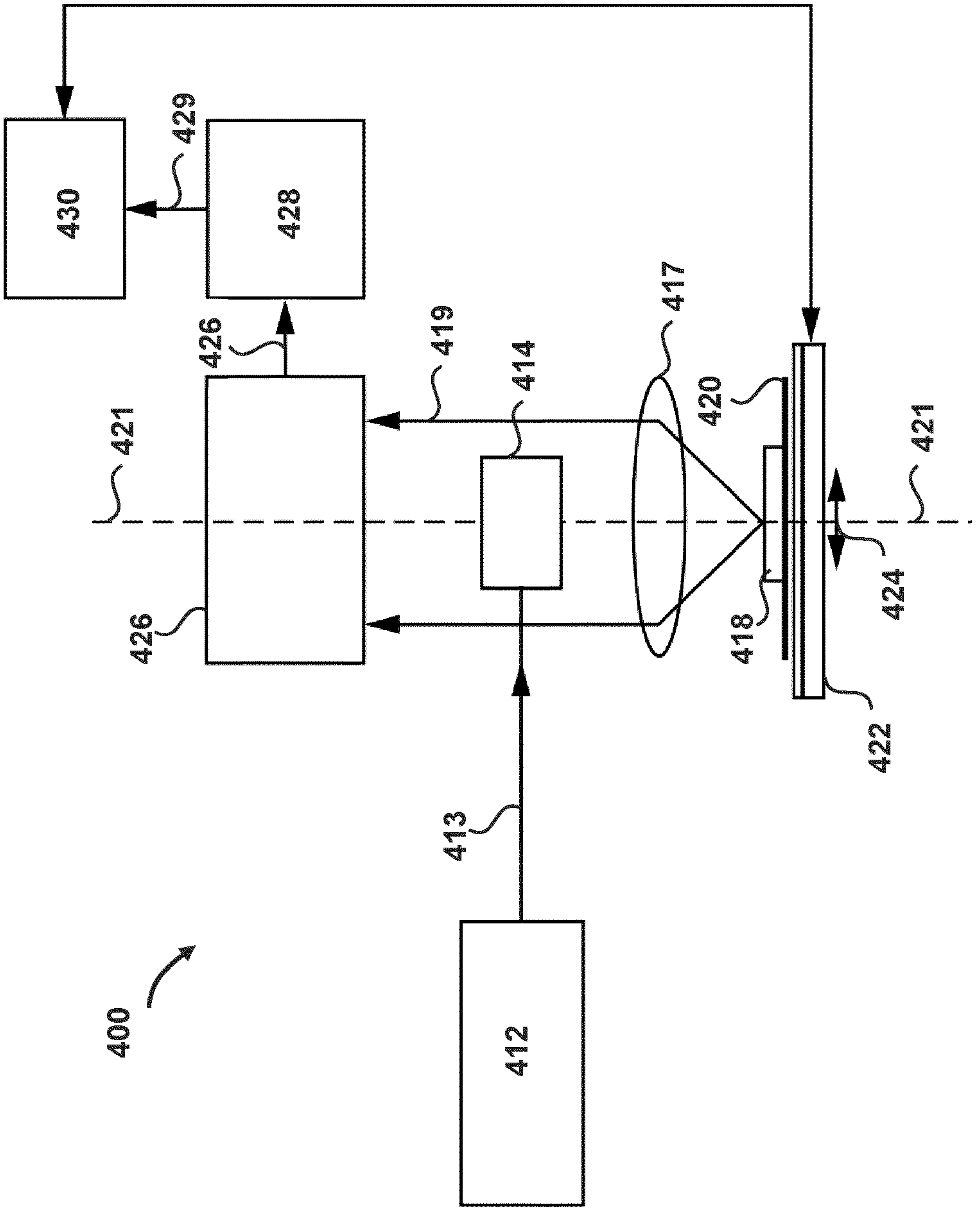
FIG. 4 is a schematic illustration of an alignment system, according to an embodiment of the present disclosure.

FIG. 4 illustrates a schematic of a cross-sectional view of an alignment system 400 that can be implemented as a part of or otherwise in conjunction with lithographic apparatus 200 or 200', and/or other lithographic apparatuses, according to an embodiment. In an example of this embodiment, alignment system 400 may be configured to align a substrate (e.g., a semiconductor wafer, substrate W described above, etc.) with respect to a patterning device (e.g., patterning device MA described above). Alignment system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, alignment system 400 may include an illumination source 412, an optical system 414, an objective 417, an image rotation interferometer 426, a detector 428, and a signal analyzer 430. Illumination source 412 may be configured to provide an electromagnetic narrow band radiation beam 413 having a first polarization state, such as a linear polarization state. In an example, the narrow band radiation beam 413 may be within a spectrum of wavelengths between about 500 nm to about 900 nm. In another example, the narrow band radiation beam 413 comprises discrete narrow passbands within a spectrum of wavelengths between about 500 nm to about 900 nm. Yet in another example, radiation beam 413 may be monochromatic, for example, provided by a monochromatic light source, such as a laser light source in illumination source 412. Polychromatic light sources such as LEDs may also be used in illumination source 412 to provide a polychromatic radiation beam 413.

Optical system 414 may be configured to receive radiation beam 413. In an example of this embodiment, optical system may be further configured to direct radiation beam 413 onto a substrate 420, as shown in FIG. 4. Optical system 414 may include a transmissive optic with at least one reflective mirror configured to direct radiation beam 413 towards alignment mark 418 located on substrate 420. Optical system 414 may also include optics that create additional illumination beams split or replicated from radiation beam 413 and direct them towards alignment mark 418.

Substrate 420 may be placed on a stage 422 moveable along direction 424. Radiation beam 413 may be configured to illuminate an alignment mark 418 located on substrate 420. Alignment mark 418 may be coated with a radiation sensitive film in an example of this embodiment. In another example, alignment mark 418 may have 180° symmetry. That is, when alignment mark 418 is rotated 180° about an axis of symmetry perpendicular to a plane of alignment mark 418, rotated alignment mark 418 may be substantially identical to an unrotated alignment mark 418.

As illustrated in FIG. 4, objective 417 may be configured to direct diffracted radiation beam 419 towards image rotation interferometer 426, according to an embodiment. Objective 417 may comprise any appropriate number of optical elements suitable for directing diffracted radiation beam 419. In an example embodiment, diffracted radiation beam 419 may be at least a portion of radiation beam 413 that is diffracted from alignment mark 418. It should be noted that even though diffracted radiation beam 419 has been shown to pass outside optical system 414 in FIG. 4, the disclosure in not so limiting. Optical system 414 may be substantially transparent to diffracted radiation beam 419 and may allow diffracted radiation beam 419 to pass through it without substantially changing the properties of diffracted radiation beam 419. It should be further noted that even though objective 417 is shown to direct radiation beam 419 towards image rotation interferometer 426, the disclosure is not so limiting. Other optical arrangements may be used to obtain the similar result of detecting diffraction signals from alignment mark 418.

In some embodiments, image rotation interferometer 426 may comprise any appropriate set of optical elements, for example, a combination of prisms that may be configured to form two images of alignment mark 418 based on the received diffracted radiation beam 419. It should be appreciated that a good quality image need not be formed, but that the features of alignment mark 418 should be resolved. Image rotation interferometer 426 may be further configured to rotate one of the two images with respect to the other of the two images 180° and recombine the rotated and unrotated images interferometrically.

Detector 428 may be configured to receive the recombined image and detect an interference as a result of the recombined image when alignment axis 421 of alignment system 400 passes through a center of symmetry (not shown) of alignment mark 418. Such interference may be due to alignment mark 418 being 180° symmetrical, and the recombined image interfering constructively or destructively, according to an example embodiment. Based on the detected interference, detector 428 may be further configured to determine a position of the center of symmetry of alignment mark 418 and consequently, detect a position of substrate 420. According to an example, alignment axis 421 may be aligned with an optical beam perpendicular to substrate 420 and passing through a center of image rotation interferometer 426.

In some embodiments, signal analyzer 430 may be configured to receive signal 429 including information of the determined center of symmetry. Signal analyzer 430 may be further configured to determine a position of stage 422 and correlate the position of stage 422 with the position of the center of symmetry of alignment mark 418. As such, the position of alignment mark 418 and consequently, the position of substrate 420 may be accurately known with reference to stage 422. Alternatively, signal analyzer 430 may be configured to determine a position of alignment system 400 or any other reference element such that the center of symmetry of alignment mark 418 may be known with reference to alignment system 400 or any other reference element.

Optical System Embodiments

FIG. 5 illustrates a schematic of a cross-sectional view of an optical system 514, according to an embodiment. Optical system 514 may represent an example embodiment of optical system 414 shown in FIG. 4. Illumination beam 513 may be similar to radiation beam 413 discussed above with respect to FIG. 4. Illumination beam 513 is on-axis since it travels along optical axis 510.

In an example of this embodiment, optical system 514 may comprise pair of glass plates 550, aperture plate 552, and transmissive optic 553. Glass plates 550 each have a plurality of spot mirrors 560 for reflecting and refracting illumination beam 513. As a result, illumination beam 513 is incident on glass plates 550 to create a pair of illumination beams 515. Illumination beams 515 are off-axis. Downstream of glass plates 550 is aperture plate 552, which selectively blocks unwanted radiation. FIG. 5 shows the case where on-axis illumination beam 513 and off-axis illumination beams 515 are preserved. Downstream of aperture plate 552 is transmissive optic 553. Transmissive optic 553 comprises a plurality of reflective mirrors 563. Each reflective mirror 563 is associated with an illumination beam. Reflective mirrors 563 reflect on-axis illumination beam 513 and off-axis illumination beams 515 toward objective 417. Objective 417 may be configured to focus illumination beams 513 and 515 onto substrate 420. Illumination beams 513 and 515 converge on alignment mark 418, shown in FIG. 4, of substrate 420.

Figure 6:
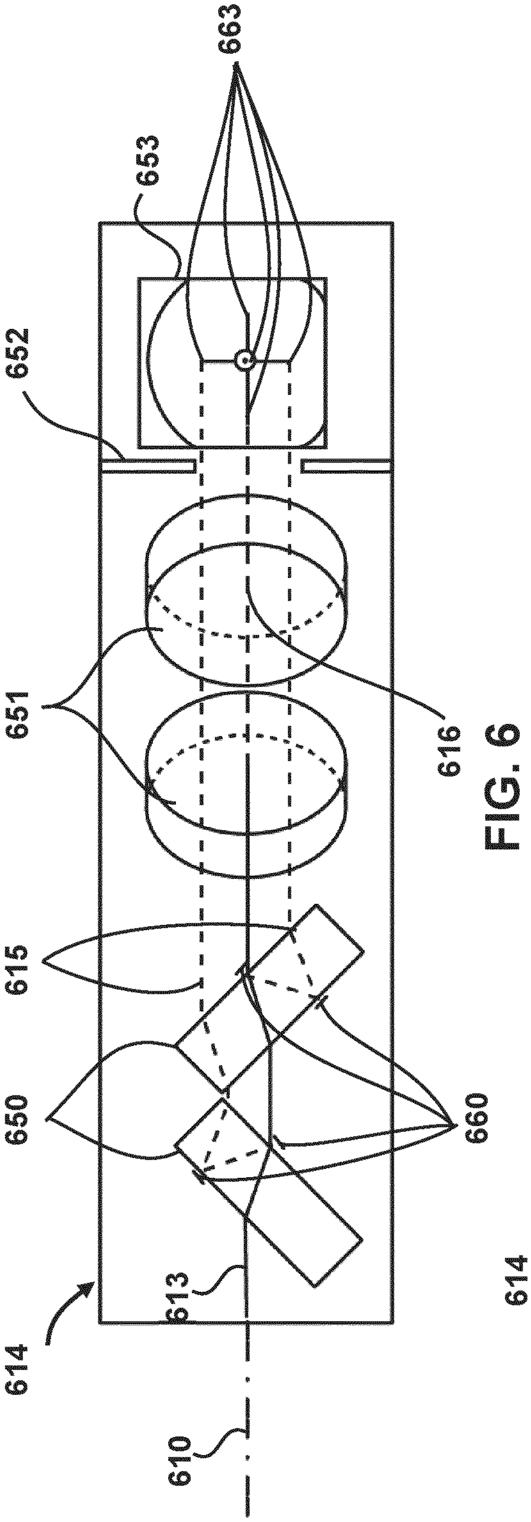
FIG. 6 is a top view of an optical system of an alignment system having two pairs of off-axis illumination beams, according to an embodiment of the present disclosure.
Figure 7:
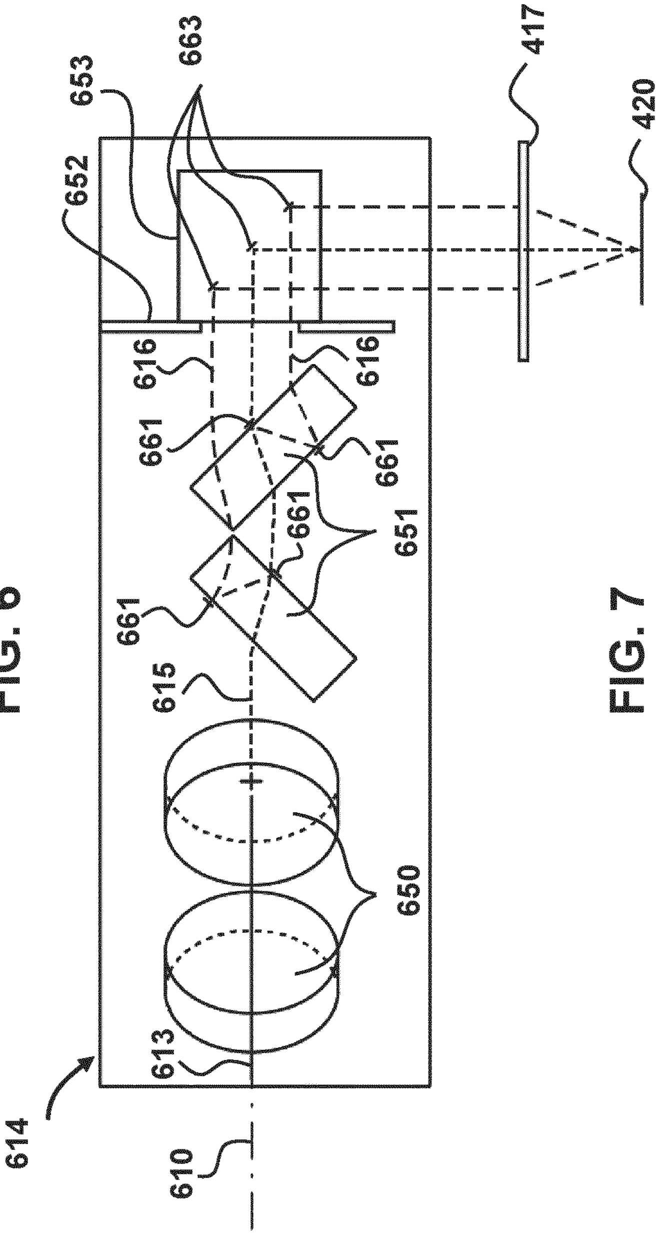
FIG. 7 is a side view of an optical system of an alignment system having two pairs of off-axis illumination beams, according to an embodiment of the present disclosure.
Figure 8:
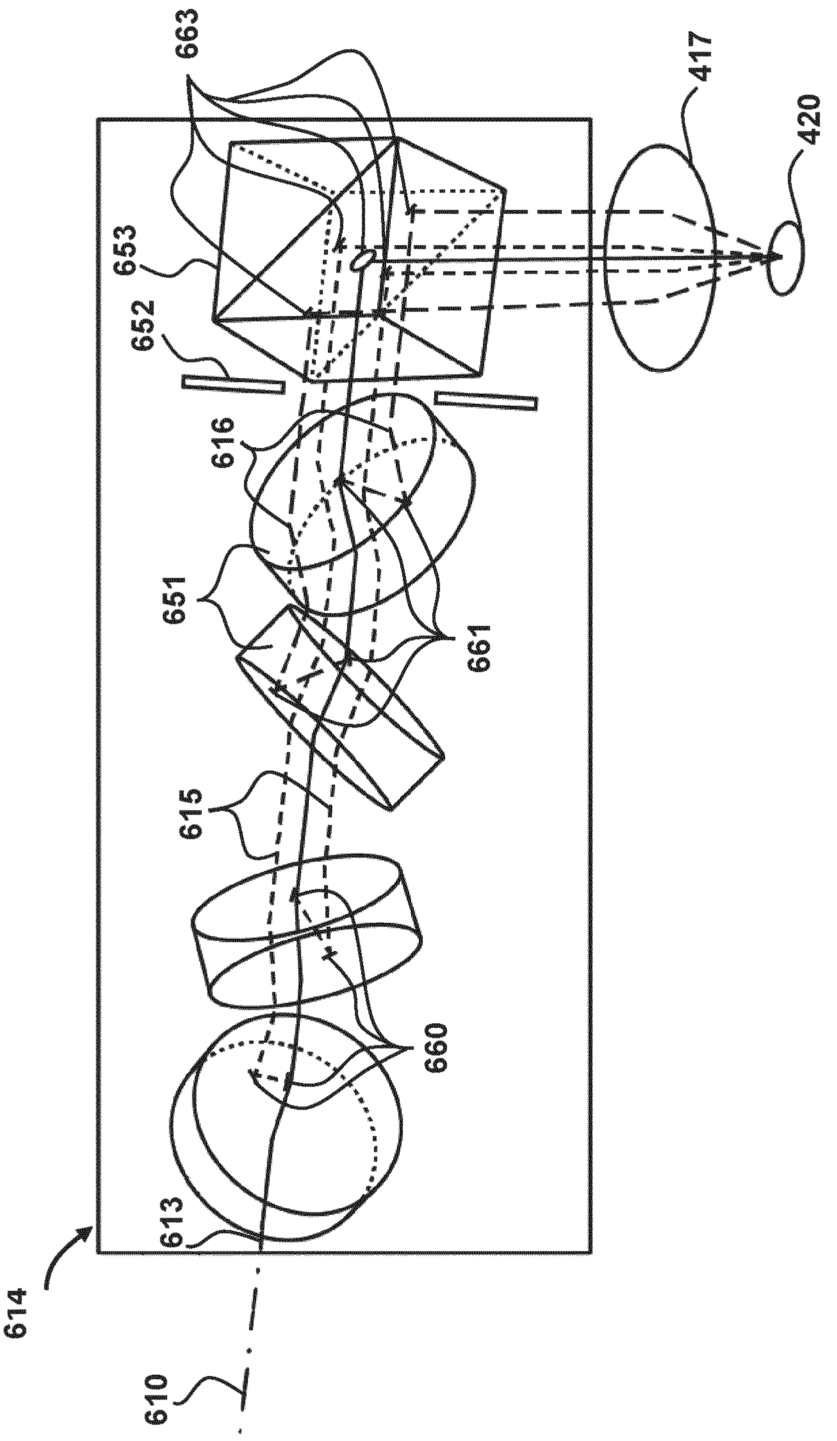
FIG. 8 is a rotated view of an optical system of an alignment system having two pairs of off-axis illumination beams, according to an embodiment of the present disclosure.

FIGS. 6-8 illustrate a schematic of a cross-sectional view of optical system 614, according to an embodiment. FIG. 6 is a top view, FIG. 7 is a side view, and FIG. 8 is a rotated view of optical system 614. Optical system 614 may represent an example embodiment of optical system 414 shown in FIG. 4. Illumination beam 613 may be similar to radiation beam 413 discussed above with respect to FIG. 4. Illumination beam 613 is on-axis since it travels along optical axis 610.

In an example of this embodiment, optical system 614 may comprise first pair of glass plates 650, second pair of glass plates 651, aperture plate 652, and transmissive optic 653. Glass plates 650 and 651 each have a plurality of spot mirrors 660 and 661, respectively, for reflecting and refracting radiation beam 613. As a result, illumination beam 613 is incident on first pair of glass plates 650 to create first pair of illumination beams 615, shown clearly in FIGS. 6 and 8. FIG. 7 only shows first illumination beam 615, because second beam 615 is underneath and covered by first beam 615 from this view (first beam 615 also covers illumination beam 613). Further, illumination beam 613 is then incident on second pair of glass plates 651 to create second pair of illumination beams 616, shown clearly in FIGS. 7 and 8. Similar to above, FIG. 6 only shows first illumination beam 616. Illumination beams 615 and 616 are off-axis illumination beams. Downstream of glass plates 650 and 651 is aperture plate 652, which selectively blocks unwanted radiation. FIGS. 6-8 show the case where on-axis illumination beam 613 and off-axis illumination beams 615 and 616 is preserved. Downstream of aperture plate 652 is transmissive optic 653. Transmissive optic 653 comprises a plurality of reflective mirrors 663. Each reflective mirror 663 is associated with an illumination beam. Reflective mirrors 663 reflect on-axis illumination beam 613 and off-axis illumination beams 615 and 616 toward objective 417, shown in FIGS. 7 and 8. Objective 417 may be configured to focus illumination beams 613, 615, and 616 onto substrate 420, shown in FIGS. 7 and 8. Illumination beams 613, 615, and 616 converge on alignment mark 418, shown in FIG. 4, of substrate 420.

While the embodiments described above have either one or two pairs of off-axis illumination beams, the system is not so limited. It is possible to create more than two pairs of off-axis illumination beams.

Glass plates 550, 650, and 651 are each a pair of glass plates. Each pair of glass plates 550, 650, and 651 receives illumination beam 513 and 613 to create a pair of off-axis illumination beams 515, 615, and 616, respectively. Additional pairs of glass plates can be inserted into the optical path to create additional pairs of off-axis illumination beams. Further, one glass plate in the pair can be finely tilted with respect to the other to change characteristics of the off-axis illumination beams. The glass plates can be tilted using a glass plate drive motor (not shown). As a result, optical path differences, amount of light, and power among the pair of beams can be controlled.

The plurality of spot mirrors 560, 660, and 661 are partially or fully reflective spot mirrors. Partially reflective spot mirrors refract some of the radiation beam, while reflecting the remainder of the beam. On the other hand, fully reflective spot mirrors reflect the entirety of the beam. Each spot mirror is a discrete area of reflective coating on the glass plate. The reflective coating comprises metal or dielectric or a combination thereof.

Aperture plate 552 and 652 is positioned between the glass plates 550, 650, and 651 and the transmissive optic 553 and 653. Aperture plate 552 and 652 blocks unwanted radiation while allowing certain illumination beams to pass through and reach alignment mark 418. Aperture plate 552 and 652 is movable into and out of the path of the illumination beams using an aperture plate drive motor (not shown). In a first configuration, aperture plate 552 and 652 blocks an on-axis illumination beam 513 and 613 and allows off-axis illumination beams 515, 615, and 616 to pass through. In a second configuration, aperture plate 552 and 652 blocks off-axis illumination beams 515, 615, and 616 and allows an on-axis illumination beam 513 and 613 to pass through. In a third configuration, aperture plate 552 and 652 allows an on-axis illumination beam 513 and 613 and off-axis illumination beams 515, 615, and 616 to pass through.

Transmissive optic 553 and 653 comprises a plurality of reflective mirrors 563. Reflective mirrors 563 can be fully reflective. The number of mirrors in the transmissive optic is equal to the number of illumination beams. Transmissive optic 553 and 653 reflects each of the beams toward objective 417.

Further details of the pairs of off-axis illumination beams follow. Pairs of off-axis illumination beams 515, 615, and 616 are in phase with each other with a matched optical path. Moreover, optical path differences between beams 515, 615, and 616 within each pair can be finely adjusted by tilting one glass plate 550, 650, and 651, respectively, with respect to the other glass plate in the pair. Additionally, off-axis illumination beams can be polarized or unpolarized. This can be achieved by adding thin film coatings onto spot mirrors 560, 660, and 661. Alternatively, a polarizer (not shown) in the optical path can change the off-axis illumination beams to either be polarized or unpolarized. Since the off-axis illumination beams are created by glass plates (as opposed to a grating structure), the off-axis illumination beams can have smaller color separation or be made fully achromatic or are colinear for different wavelengths. In other words, the off-axis illumination beams are all the same color and not a spectrum of colors as is for a grating structure. As a result, the illumination angle for all colors of the off-axis illumination beams is the same. Further, the spectral content of the off-axis illumination beams can be controlled by adding film coatings. Film coatings will change the power intensity of the off-axis illumination beams.

In some embodiments, optical system 514 and 614 can be inserted into existing alignment systems, similar to alignment system 400 in FIG. 4. As a result, optical system 514 and 614 is backwards compatible and can be used to upgrade existing alignment systems.

The embodiments may further be described using the following clauses:

1. An alignment illumination system, comprising:
   an illumination source;
   at least a pair of glass plates, wherein each glass plate has a plurality of spot mirrors that can reflect or partially reflect and transmit an illumination beam from the illumination source;
   a transmissive optic with at least one reflective mirror configured to reflect radiation received from the glass plates; and
   an objective configured to focus light from the transmissive optic towards an object to be illuminated.
2. The alignment illumination system of clause 1, wherein the glass plates reflect and refract the illumination beam to create pairs of off-axis illumination beams.
3. The alignment illumination system of clause 2, wherein the off-axis illumination beams in each pair are in phase with each other.
4. The alignment illumination system of clause 2, wherein the optical path differences of the off-axis illumination beams in each pair can be controlled by tilting one glass plate in the pair with respect to the other using a glass plate drive motor.
5. The alignment illumination system of clause 2, wherein the off-axis illumination beams have small color separation or are colinear for different wavelengths.
6. The alignment illumination system of clause 2, wherein the illumination angles for all colors of the off-axis illumination beams are the same.
7. The alignment illumination system of clause 2, wherein the spectral content of the off-axis illumination beams or on-axis illumination beam can be controlled by adding thin film coatings onto the spot mirrors.
8. The alignment illumination system of clause 2, wherein the off-axis illumination beams are polarized by adding thin film coatings onto the spot mirrors.
9. The alignment illumination system of clause 2, wherein the off-axis illumination beams are unpolarized.
10. The alignment illumination system of clause 1, wherein an aperture plate positioned between the glass plates and the transmissive optic blocks unwanted radiation.
11. The alignment illumination system of clause 10, wherein the aperture plate blocks an on-axis illumination beam and allows off-axis illumination beams to pass through.
12. The alignment illumination system of clause 10, wherein the aperture plate blocks off-axis illumination beams and allows an on-axis illumination beam to pass through.
13. The alignment illumination system of clause 10, wherein the aperture plate allows an on-axis illumination beam and off-axis illumination beams to pass through.
14. The alignment illumination system of clause 1, wherein the plurality of spot mirrors comprises metal or dielectric or a combination thereof.
15. The alignment illumination system of clause 1, wherein the at least a pair of glass plates comprises exactly two glass plates.
16. The alignment illumination system of clause 15, wherein the two glass plates create a pair of off-axis illumination beams.
17. The alignment illumination system of clause 1, wherein the at least a pair of glass plates comprises four glass plates to create two pairs of off-axis illumination beams.
18. An alignment system for measuring alignment of an object, wherein the alignment illumination system of clause 1 and an adjustable aperture stop can be inserted into the alignment system to create pairs of off-axis illumination beams.
19. An alignment system, comprising:
   an illumination source;
   at least a pair of glass plates, wherein each glass plate has a plurality of spot mirrors that can reflect or partially reflect and transmit an illumination beam from the illumination source;
   an aperture stop;
   a transmissive optic with at least one reflective mirror configured to reflect radiation received from the glass plates;
   an objective configured to focus light from the transmissive optic towards an object to be illuminated;
   an object stage for holding the object to be illuminated; and
   an interferometer configured to measure a mark on the object.
20. A method for alignment using an alignment illumination system, comprising:

illuminating—an illumination beam from an illumination source;

reflecting or partially reflecting and transmitting the illumination beam from the illumination source using at least a pair of glass plates, wherein each glass plate has a plurality of spot mirrors;

reflecting radiation received from the glass plates using a transmissive optic with at least one reflective mirror; and focusing light from the transmissive optic towards an object to be illuminated using an objective.

21. The method of clause 20, wherein the glass plates reflect and refract the illumination beam to create pairs of off-axis illumination beams.

22. The method of clause 21, wherein the off-axis illumination beams in each pair are in phase with each other.

23. The method of clause 21, wherein the optical path differences of the off-axis illumination beams in each pair can be controlled by tilting one glass plate in the pair with respect to the other using a glass plate drive moto 24. The method of clause 21, wherein the off-axis illumination beams have small color separation or are colinear for different wavelengths.

25. The method of clause 21, wherein the illumination angles for all colors of the off-axis illumination beams are the same.

26. The method of clause 21, wherein the spectral content of the off-axis illumination beams or on-axis illumination beam can be controlled by adding thin film coatings onto the spot mirrors.

27. The method of clause 21, wherein the off-axis illumination beams are polarized by adding thin film coatings onto the spot mirrors.

28. The method of clause 21, wherein the off-axis illumination beams are unpolarized.

29. The method of clause 20, wherein an aperture plate positioned between the glass plates and the transmissive optic blocks unwanted radiation.

30. The method of clause 29, wherein the aperture plate blocks an on-axis illumination beam and allows off-axis illumination beams to pass through.

31. The method of clause 29, wherein the aperture plate blocks off-axis illumination beams and allows an on-axis illumination beam to pass through.

32. The method of clause 29, wherein the aperture plate allows an on-axis illumination beam and off-axis illumination beams to pass through.

33. The method of clause 20, wherein the plurality of spot mirrors comprises metal or dielectric or a combination thereof.

34. The method of clause 20, wherein the at least a pair of glass plates comprises exactly two glass plates.

35. The method of clause 34, wherein the two glass plates create a pair of off-axis illumination beams.

36. The method of clause 20, wherein the at least a pair of glass plates comprises four glass plates to create two pairs of off-axis illumination beams.

37. A method for measuring alignment of an object using an alignment system, wherein the alignment illumination system of clause 20 and an adjustable aperture stop can be inserted into the alignment system to create pairs of off-axis illumination beams.

38. A method for alignment using an alignment illumination system, comprising:

illuminating an illumination beam from an illumination source;

reflecting or partially reflecting and transmitting the illumination beam from the illumination source using at least a pair of glass plates, wherein each glass plate has a plurality of spot mirrors;

filtering radiation received from the glass plates using an aperture stop;

reflecting radiation received from the aperture stop using a transmissive optic with at least one reflective mirror;

focusing light from the transmissive optic towards an object held by an object stage to be illuminated using an objective; and measuring a mark on the object using an interferometer.

This specification discloses one or more embodiments that incorporate the features of this invention. The disclosed embodiment(s) merely exemplify the invention. The scope of the invention is not limited to the disclosed embodiment (s). The invention is defined by the claims appended hereto. The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength 2 of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

The term "in substantial contact" as used herein generally describes elements or structures that are in physical contact with each other with only a slight separation from each other which typically results from misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include misalignment tolerances without departing from the spirit and scope of the present disclosure.

The term "optically coupled" as used herein generally refers to one coupled element being configured to impart light to another coupled element directly or indirectly.

The term "optical material" as used herein generally refers to a material that allows light or optical energy to propagate therein or therethrough.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments but should be defined only in accordance with the following claims and their equivalents.

The invention claimed is:

1. An alignment illumination system, comprising:
- an illumination source;
- at least a pair of glass plates, wherein each glass plate has a plurality of spot mirrors that can reflect, or partially reflect and transmit, an illumination beam from the illumination source;
- a transmissive optic with at least one reflective mirror configured to reflect radiation received from the glass plates; and
- an objective configured to focus radiation from the transmissive optic towards an object to be illuminated.

2. The alignment illumination system of claim 1, wherein the glass plates reflect and refract the illumination beam to create pairs of off-axis illumination beams.

3. The alignment illumination system of claim 2, wherein the off-axis illumination beams in each pair are in phase with each other.

4. The alignment illumination system of claim 2, wherein the optical path differences of the off-axis illumination beams in each pair are controllable by tilting one glass plate in the pair with respect to the other glass plate in the pair using a glass plate drive motor.

5. The alignment illumination system of claim 2, wherein the off-axis illumination beams have color separation or are colinear for different wavelengths.

6. The alignment illumination system of claim 2, wherein illumination angles for all colors of the off-axis illumination beams are the same.

7. The alignment illumination system of claim 2, wherein the spectral content of the off-axis illumination beams or an on-axis illumination beam are controlled by a thin film coating on the spot mirrors.

8. The alignment illumination system of claim 2, wherein the off-axis illumination beams are polarized by a thin film coating on the spot mirrors.

9. The alignment illumination system of claim 2, wherein the off-axis illumination beams are unpolarized.

10. The alignment illumination system of claim 1, wherein an aperture plate positioned between the glass plates and the transmissive optic blocks unwanted radiation.

11. The alignment illumination system of claim 10, wherein the aperture plate blocks an on-axis illumination beam and allows off-axis illumination beams to pass through.

12. The alignment illumination system of claim 10, wherein the aperture plate blocks off-axis illumination beams and allows an on-axis illumination beam to pass through.

13. The alignment illumination system of claim 10, wherein the aperture plate allows an on-axis illumination beam and off-axis illumination beams to pass through.

14. The alignment illumination system of claim 1, wherein the plurality of spot mirrors comprises metal or dielectric or a combination thereof.

15. The alignment illumination system of claim 1, wherein the at least a pair of glass plates comprises exactly two glass plates.

16. An alignment system, comprising:

an illumination source;

at least a pair of glass plates, wherein each glass plate has a plurality of spot mirrors that can reflect, or partially reflect and transmit, an illumination beam from the illumination source;

an aperture stop;

a transmissive optic with at least one reflective mirror configured to reflect radiation received from the glass plates;

an objective configured to focus radiation from the transmissive optic towards an object to be illuminated;

an object stage to hold the object to be illuminated; and an interferometer configured to measure a mark on the object.

17. A method for alignment illumination, the method comprising:

reflecting, or partially reflecting and transmitting, an illumination beam from an illumination source using at least a pair of glass plates, wherein each glass plate has a plurality of spot mirrors;

reflecting radiation received from the glass plates using a transmissive optic with at least one reflective mirror; and focusing radiation from the transmissive optic towards an object to be illuminated using an objective.

18. The method of claim 17, wherein the glass plates reflect and refract the illumination beam to create pairs of off-axis illumination beams.

19. The method of claim 17, further comprising blocking unwanted radiation using an aperture plate positioned between the glass plates and the transmissive optic.

20. A method for alignment using an alignment illumination system, the method comprising:

reflecting, or partially reflecting and transmitting, an illumination beam from an illumination source using at least a pair of glass plates, wherein each glass plate has a plurality of spot mirrors;

filtering radiation received from the glass plates using an aperture stop;

reflecting radiation received from the aperture stop using a transmissive optic with at least one reflective mirror;

focusing radiation from the transmissive optic towards an object held by an object stage to be illuminated using an objective; and measuring a mark on the object using an interferometer.

* * * * *